United States Patent
Chrysler et al.

(10) Patent No.: US 7,063,268 B2
(45) Date of Patent: Jun. 20, 2006

(54) ELECTRO-ACTIVE FLUID COOLING SYSTEM

(75) Inventors: Gregory M. Chrysler, Chandler, AZ (US); Gilroy J. Vandentop, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 55 days.

(21) Appl. No.: 10/874,131

(22) Filed: Jun. 21, 2004

(65) Prior Publication Data

US 2005/0279109 A1    Dec. 22, 2005

(51) Int. Cl.
*G05D 23/02* (2006.01)
*F25D 23/12* (2006.01)
*F16K 31/02* (2006.01)
*F16K 17/04* (2006.01)
*H05K 7/20* (2006.01)

(52) U.S. Cl. .................. 236/93 R; 236/93 A; 62/259.2; 310/365; 251/129.01; 137/67; 361/699; 417/413.1

(58) Field of Classification Search .............. 236/93 R, 236/93 A; 62/259.2; 310/365, 366; 251/129.01, 251/129.06; 137/67; 361/699; 417/413.1
See application file for complete search history.

(56) References Cited

U.S. PATENT DOCUMENTS

| | | | |
|---|---|---|---|
| 6,650,542 B1 | 11/2003 | Chrysler et al. | 361/699 |
| 6,785,134 B1 | 8/2004 | Maveety et al. | 361/699 |
| 6,845,622 B1 | 1/2005 | Sauciuc et al. | 62/3.7 |
| 2003/0173873 A1* | 9/2003 | Bryant et al. | 310/365 |
| 2003/0214199 A1 | 11/2003 | Heim et al. | 310/309 |
| 2004/0008853 A1 | 1/2004 | Pelrine et al. | 381/191 |
| 2004/0108479 A1* | 6/2004 | Garnier et al. | 251/129.01 |

OTHER PUBLICATIONS

Eduardo A. Sanchez et al., "Micro-Impeller Miniature Centrifugal Compressor", U.S. Appl. No. 10/323,528, filed Dec. 18, 2002.
Gregory M. Chrysler et al. "Integrated Micro Channels and Manifold/Plenum Using Separate Silicon or Low-Cost Polycrystalline Silicon", U.S. Appl. No. 10/749,901, filed Dec. 29, 2003.
Kramadhati V. Ravi et al., "IC Die with Directly Bonded Liquid Cooling Device", U.S. Appl. No. 10/813, 187, filed Mar. 29, 2004.

* cited by examiner

*Primary Examiner*—Marc Norman
(74) *Attorney, Agent, or Firm*—Michael D. Plimier

(57) ABSTRACT

Embodiments of the invention provide one or more valves in which an electroactive material acts to open or close the valves to increase efficiency of a pump, which may be a pump that uses an electroactive diaphragm to pump fluid. The valves and pump may pump fluid to cool a device in a system.

24 Claims, 10 Drawing Sheets

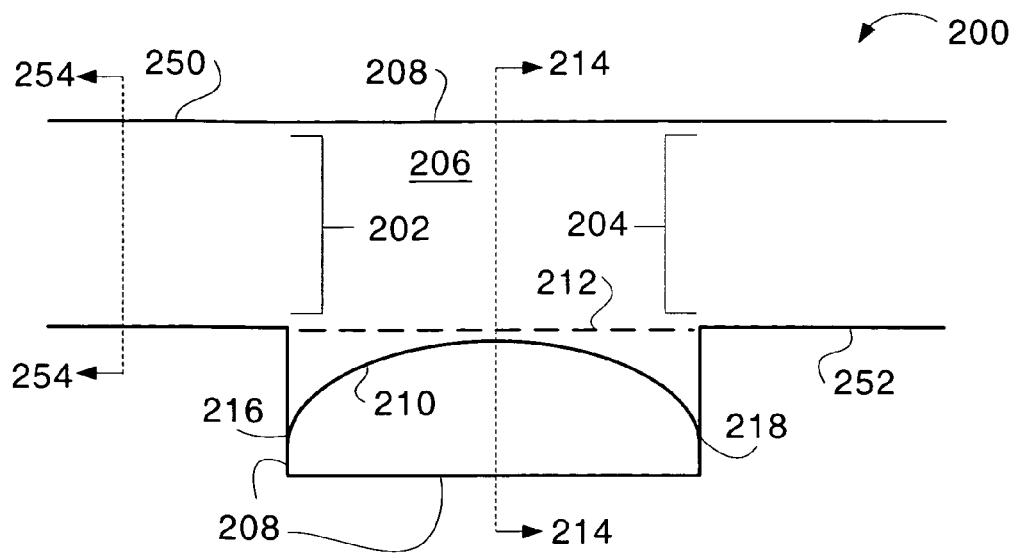
Figure 2
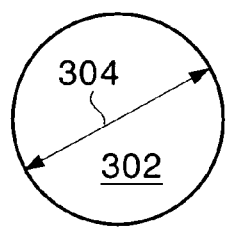
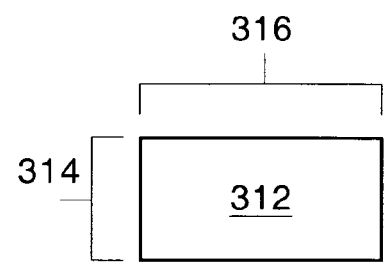
Figure 3a    Figure 3b    Figure 3c

US 7,063,268 B2

ELECTRO-ACTIVE FLUID COOLING SYSTEM

BACKGROUND

BACKGROUND OF THE INVENTION

Integrated circuit devices, microprocessors and other related computer components are becoming more and more powerful with increasing capabilities, resulting in increasing amounts of heat generated from these components. Packaged units and integrated circuit die sizes of these components are decreasing or remaining the same, which increases the amount of heat energy given off by the components for a given unit of surface area. Furthermore, as computer related equipment becomes more powerful, more and more components are being placed inside the equipment which is also decreasing in size, resulting in additional heat generation in a smaller volume of space. Increased temperatures can potentially damage the components of the equipment, or reduce the lifetime of the individual components and the equipment. Various techniques and devices can be used to dissipate the large amounts of heat produced by many such integrated circuits.

BRIEF DESCRIPTION OF THE DRAWINGS

FIG. 2 is a cross sectional side view that illustrates a valve according to one embodiment.

FIGS. 3a through 3c illustrate some cross sectional shapes of the fluid lines.

DETAILED DESCRIPTION

Figure 1A:
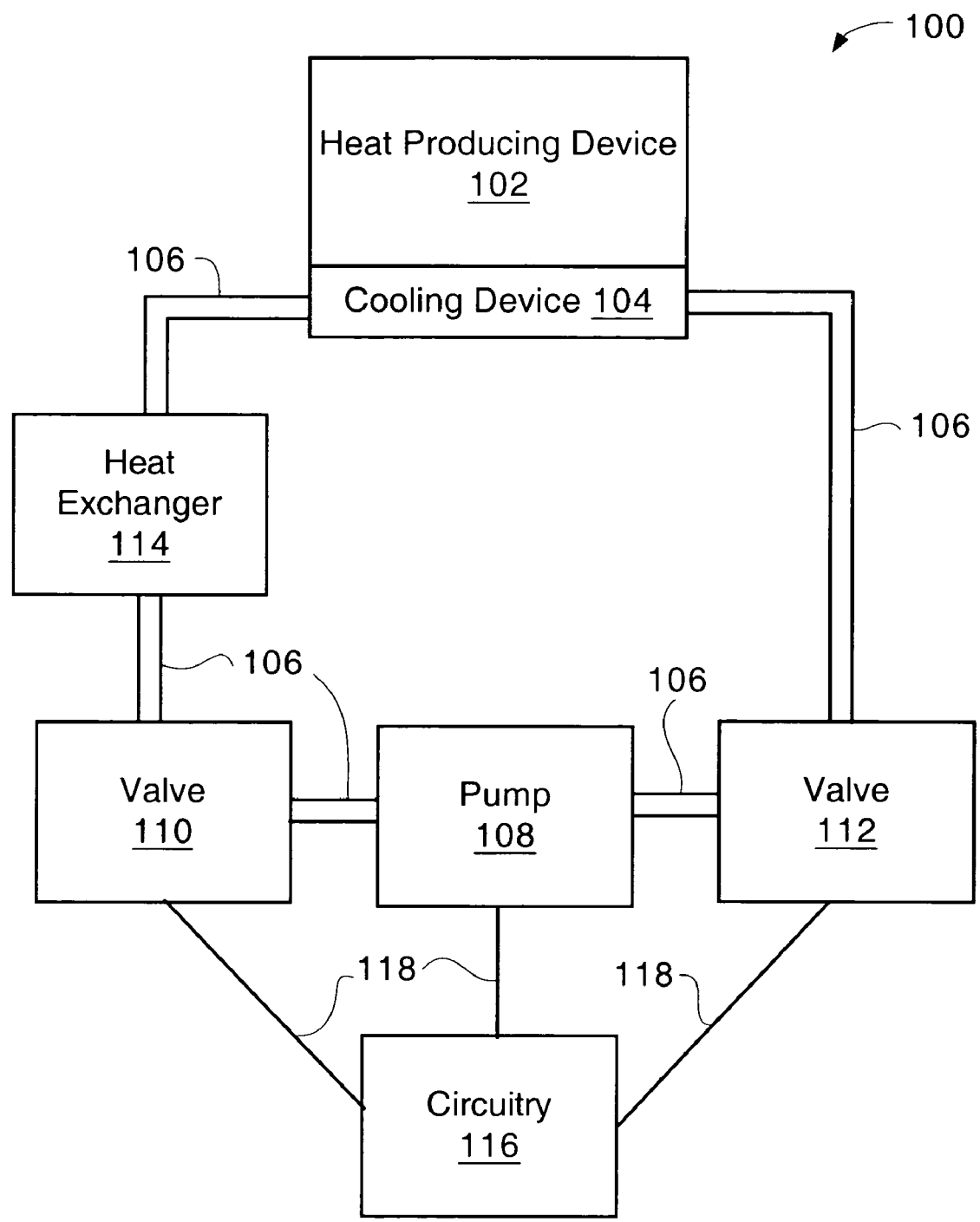
FIG. 1a is a block diagram of a system according to one embodiment of the invention.

FIG. 1a is a block diagram of a system 100 according to one embodiment of the invention. The system 100 includes a heat producing device 102. In some embodiments, the heat producing device 102 may be a microelectronic device, such as a microprocessor, a chipset for a motherboard, or another microelectronic device. Other embodiments may have other types of heat producing devices 102 that are not microelectronic devices.

The heat producing device 102 may be coupled to a cooling device 104. The heat producing device 102 and cooling device 104 may be in contact so that heat may be transferred from the heat producing device 102 to the cooling device 104. Alternatively, a device or structure (not shown) may transfer heat from the heat producing device 102 to the cooling device 104. In an embodiment, the cooling device 104 may comprise fluid channels so that cool fluid may enter the cooling device, collect heat from the cooling device 104, and then leave the cooling device as warm fluid.

In an embodiment, fluid may travel along a fluid line 106 between the cooling device 104, a heat exchanger 114, a pump 108 with two valves 110, 112 and back to the cooling device 104. The heat exchanger 114 may be a radiator in an embodiment, where heat from the fluid is transferred to surrounding air. In other embodiments of the system 100, the heat exchanger may be different devices or structures. Thus, by removing heat from the heat producing device 102 and dispersing it by the heat exchanger 114, the heat producing device 102 may be kept cool.

The pump 108 may pump the fluid through the cooling device 104, fluid lines 106, and heat exchanger 114. One or more valves 110, 112 may be connected to the pump to increase efficiency of the pump 108 and help ensure that fluid is pumped in the proper direction in the system 100. One or more of the pump 108 and/or valves 110, 112 may include no moving parts aside from a piece of electroactive material, which may allow the pump 108 and/or valves 110, 112 to reliably operate for extended periods of operation without maintenance. In some embodiments, the electroactive material may move and cause a structure connected to the electroactive material to also move. Such embodiments may also allow the pump 108 and/or valves 110, 112 to reliably operate for extended periods of operation without maintenance.

Circuitry 116 may be electrically connected to the pump 108 and valves 110, 112. The circuitry 116 may control operation of the pump 108 and valves 110, 112 and may deliver electrical power to the pump 108 and valves 110, 112. Such a use of circuitry 116 with electroactive pump 108 and/or valves 110, 112 may allow precise electronic control of the operation of the pump 108 and/or valves 110, 112.

Figure 1B:
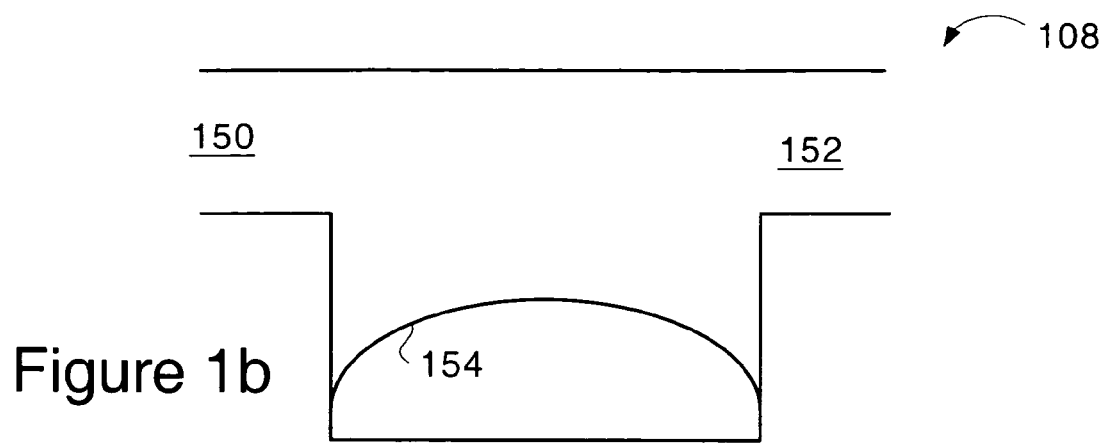
FIGS. 1b through 1d are cross sectional side views that illustrate one type of pump that may be used in some embodiments of the system.
Figure 1C:
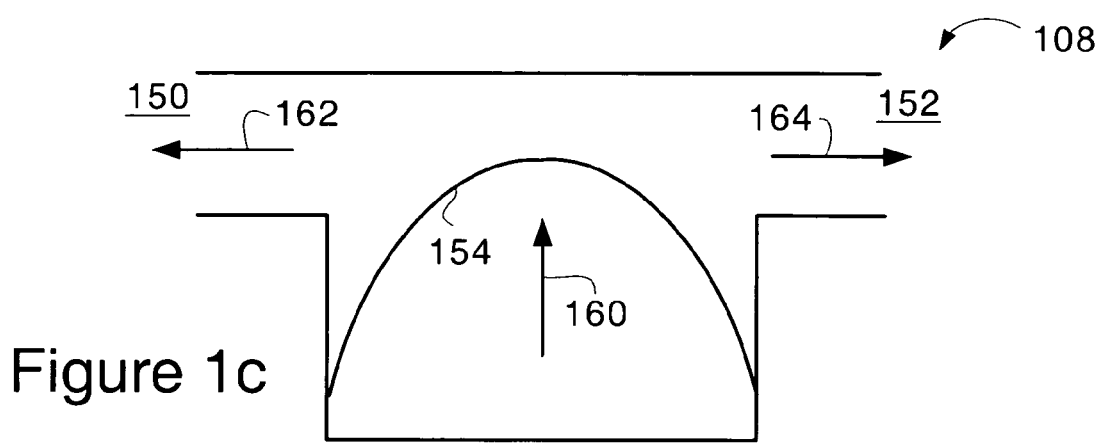
Figure 1D:
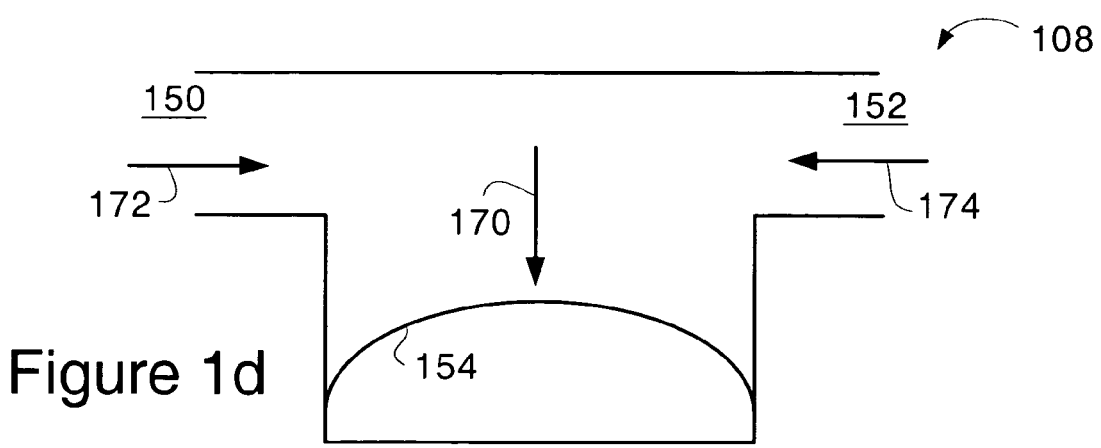

FIGS. 1b through 1d are cross sectional side views that illustrate one type of pump 108 that may be used in some embodiments of the system 100. In some embodiments, the pump 108 may be a diaphragm pump, as illustrated in FIGS. 1b through 1d. In other embodiments, other types of pumps, such as a flagella pump, a piston pump, or another type of pump may be used.

FIG. 1b illustrates a diaphragm pump 108 with an inlet 150, an outlet 152, and a diaphragm 154. The diaphragm 154 may have a dome shape in some embodiments. The dome may expand and contract to perform the pumping. In FIG. 1b, the dome is illustrated in a contracted state.

FIG. 1c illustrates the diaphragm 154 expanding in the direction of arrow 160. This expansion may be accomplished by using an electroactive material with transducers as the diaphragm 154. For example, top and bottom electrodes may be attached to an electroactive polymer on its top and bottom surfaces, respectively, to provide a voltage difference across the polymer, or to receive electrical energy from the polymer. The polymer may deflect with a change in electric field provided by the top and bottom electrodes. The electrodes may be compliant and change shape with polymer. In one embodiment, one of the electrodes is ground.

Materials suitable for use as an electroactive polymer with the present invention may include any substantially insulating polymer or rubber (or combination thereof) that deforms in response to an electrostatic force or whose deformation results in a change in electric field. One suitable material is NuSil CF19-2186 as provided by NuSil Technology of Carpenteria, Calif. Other exemplary materials suitable for use as a pre-strained polymer include silicone elastomers, acrylic elastomers such as VHB 4910 acrylic elastomer as produced by 3M Corporation of St. Paul, Minn., polyurethanes, thermoplastic elastomers, copolymers comprising PVDF, pressure-sensitive adhesives, fluoroelastomers, polymers comprising silicone and acrylic moieties, and the like. Polymers comprising silicone and acrylic moieties may include copolymers comprising silicone and acrylic moieties, polymer blends comprising a silicone elastomer and an acrylic elastomer, for example. Combinations of some of these materials may also be used as the electroactive polymer in transducers or electrodes.

Materials used as an electroactive polymer may be selected based on one or more material properties such as a high electrical breakdown strength, a low modulus of elasticity—(for large or small deformations), a high dielectric constant, etc. In one embodiment, the polymer may be selected such that has an elastic modulus at most about 100 MPa. In some embodiments, the polymer is selected such that is has a maximum actuation pressure between about 0.05 MPa and about 10 MPa, or between about 0.3 MPa and about 3 MPa. In other embodiments, the polymer is selected such that is has a dielectric constant between about 2 and about 20, or between about 2.5 and about 12. Elecroactive materials used are not limited to those having characteristics in these ranges.

As the diaphragm 154 expands, the volume within the pump 108 that is available to fluid decreases. This tends to drive fluid out both the inlet 150 in the direction of arrow 162 and out the outlet 152 in the direction of arrow 164, rather than just out the outlet as may be desired.

FIG. 1d illustrates the diaphragm 154 contracting in the direction of arrow 170. As the diaphragm 154 contracts, the volume within the pump 108 that is available to fluid increases. This tends to pull fluid in both the inlet 150 in the direction of arrow 172 and out the outlet 152 in the direction of arrow 174, rather than just out the inlet as may be desired.

FIG. 2 is a cross sectional side view that illustrates a valve 200 according to one embodiment of the present invention, such as valve 110 and/or 112 of the system 100 of FIG. 1. One or more valves 200 may be used in the system 100 to reduce or completely prevent fluid from being driven out the inlet 150 of the pump 108 when the diaphragm 154 expands and/or may reduce the amount or completely prevent fluid from being pulled into the outlet 152 of the pump 108 when the diaphragm 154 contracts. This may thus increase the pumping efficiency of the pump 108 and increase the flow of fluid through the system 100 through the cooling device 104 and heat exchanger 114, increasing the removal of heat from the heat producing device 102.

The valve 200 may include an inlet 202 and an outlet 204. In some embodiments, the inlet 202 and/or outlet 204 may be connected to an inlet fluid line 250 and/or an outlet fluid line 252. In other embodiments, one or both of the inlet 202 and/or outlet 204 may be directly connected to another component, such as the pump 108, the heat exchanger 114, or other component, without an intervening fluid line.

FIGS. 3a through 3c illustrate some cross sectional shapes of the fluid lines 250, 252 taken through line 254—254 of FIG. 2. In some embodiments, the inlet 202 and/or outlet 204 may have the same shape as the fluid line to which the inlet 202 and/or outlet 204 is connected. Other cross sectional shapes of the fluid lines besides those illustrated in FIGS. 3a through 3c and described below may be used in some embodiments.

FIG. 3a illustrates a fluid line 302 with an elliptical (circular as illustrated) cross section. In some embodiments, the elliptical line 302 may have a maximum distance 304 from one point on the perimeter to another point on the perimeter of less than or equal to about ⅛ of an inch, so that the cross sectional area of the line 302 may be about 0.012 square inches or less. In other embodiments, the distance 304 may be less than or equal to about 1 millimeter. In yet other embodiments, the distance 304 may be even smaller.

FIG. 3b illustrates a fluid line 306 with a square cross section. In some embodiments, the height 308 and width 310 of the fluid line may each be less than or equal to about ⅛ of an inch. In other embodiments, the height 308 and width 310 may each be less than or equal to about 1 millimeter. In yet other embodiments, the height 308 and width 310 may be even smaller.

FIG. 3c illustrates a fluid line 312 with a rectangular cross section. In some embodiments, the height 314 and width 316 of the fluid line may each be less than or equal to about ⅛ of an inch. In other embodiments, the height 314 and width 316 may each be less than or equal to about 1 millimeter. In yet other embodiments, the height 314 and width 316 may be even smaller.

Returning to FIG. 2, the valve 200 may also include a fluid volume 206 that may allow fluid to flow through the valve 200 between the inlet 202 and the outlet 204. The fluid volume 206 may be partially defined by housing walls 208 of the valve 200. The fluid volume 206 may be partially defined by a boundary 212 that is not a housing wall 208. The boundary 212 may be a non-physical boundary, and simply be a conceptual aid used in FIG. 2 for understanding the fluid volume 206.

In an embodiment, a piece of electroactive material 210 may be attached to the housing walls 208 of the valve 200. The electroactive material 210 in the valve 200 may be one of the materials, such as an electroactive polymer, described above with respect to the pump 108. Additionally, top and bottom electrodes (not shown) may be attached to the piece of electroactive material 210 to allow application of a voltage difference across the piece of electroactive material 210, as described above.

The piece of electroactive material 210 may be located outside of the fluid volume 206 and outside the boundary 212 when the piece of electroactive material 210 is in a contracted shape (as it is illustrated in FIG. 2). The piece of electroactive material 210 may be connected to the housing 208 at one or more points. For example, in one embodiment, the piece of electroactive material 210 may be connected to the housing 208 at one or more points along a border of the piece of electroactive material 210.

In the embodiment illustrated in FIG. 2, the piece of electroactive material 210 contacts the housing 208 at points 216 and 218. The cross section of the piece of electroactive material 210 between the points 216 and 218 is in the shape of an arc, with a first arc length that is the distance along the piece of electroactive material 210 between points 216 and 218.

Figure 4A:
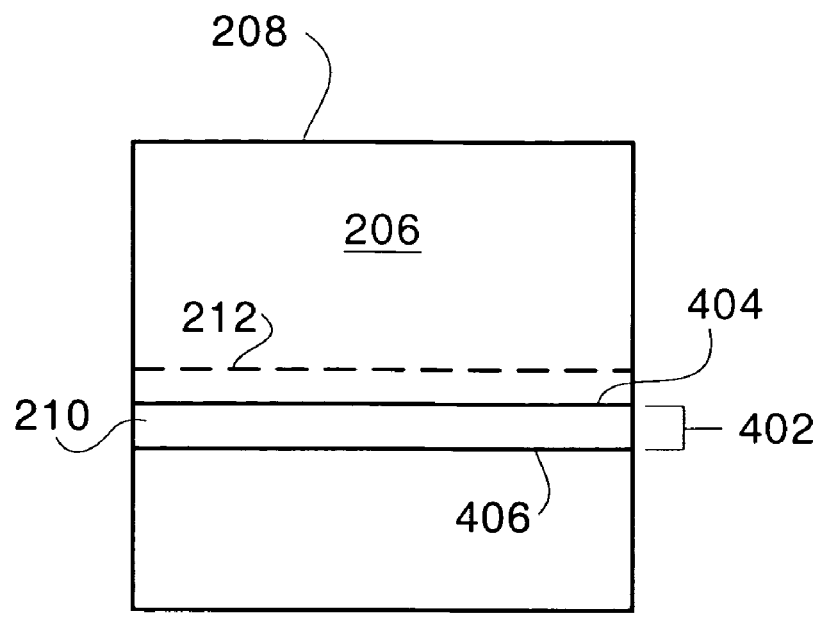
FIGS. 4a and 4b are cross sectional views that illustrate the valve and the piece of electroactive material.
Figure 4B:
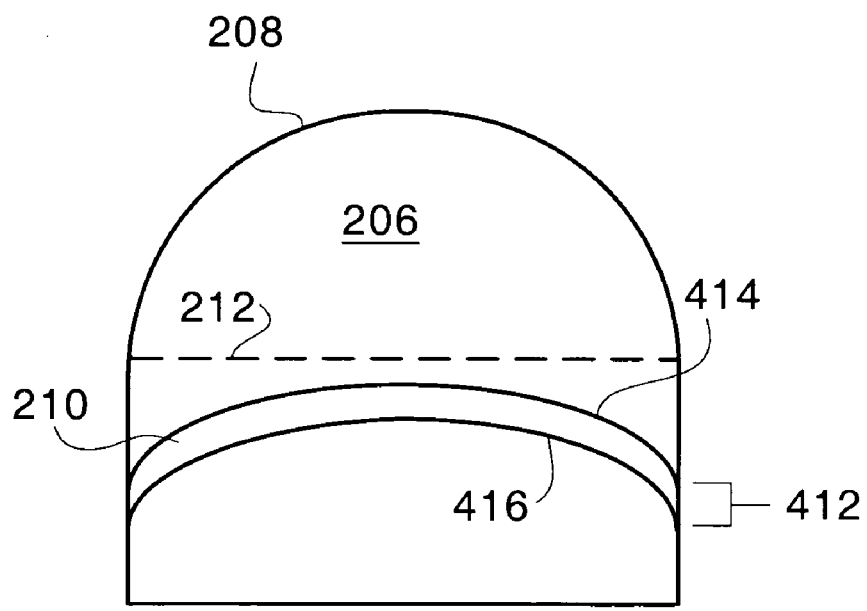

FIGS. 4a and 4b are cross sectional views that illustrate the valve and the piece of electroactive material 210 taken through line 214—214 of FIG. 2 according to two different embodiments. FIG. 4a illustrates one embodiment in which the contracted piece of electroactive material 210 may be a sheet of electroactive material that has an arced shape along one axis, but is flat along another axis perpendicular to the first axis. Thus, the piece of electroactive material 210 in FIG. 4a has a top surface 404 and a bottom surface 406 which are substantially straight along a horizontal axis shown in the view of FIG. 4a. Note, however, that they are curved along one axis, as illustrated in FIG. 2, so that the top surface 404 is a convex surface and the bottom surface 406 is a concave surface. While the piece of electroactive material 210 is contracted, the piece of electroactive material 210 may remain below the boundary 212 of the fluid volume 206, so that the piece of electroactive material 210 does not interfere with fluid flowing through the valve 200 in the fluid volume 206. Further, the piece of electroactive material 210 may have a first thickness 402 when the piece of electroactive material 210 is contracted.

FIG. 4b illustrates a second embodiment in which the contracted piece of electroactive material 210 may be a sheet of electroactive material that has a dome shape. Thus, the piece of electroactive material 210 in FIG. 4b has a top surface 414 and a bottom surface 416 which are substantially curved along both the axis shown in the view of FIG. 4b and the view shown in FIG. 2. The top surface 414 may be a convex surface and the bottom surface 416 may be a concave surface. While the piece of electroactive material 210 is contracted, the piece of electroactive material 210 may remain below the boundary 212 of the fluid volume 206, so that the piece of electroactive material 210 does not interfere with fluid flowing through the valve 200 in the fluid volume 206. Further, the piece of electroactive material 210 has a first thickness 412 when the piece of electroactive material 210 is contracted. Additionally, the housing wall 208 at the top of the valve 200 may have a curved shape in this embodiment.

Figure 5:
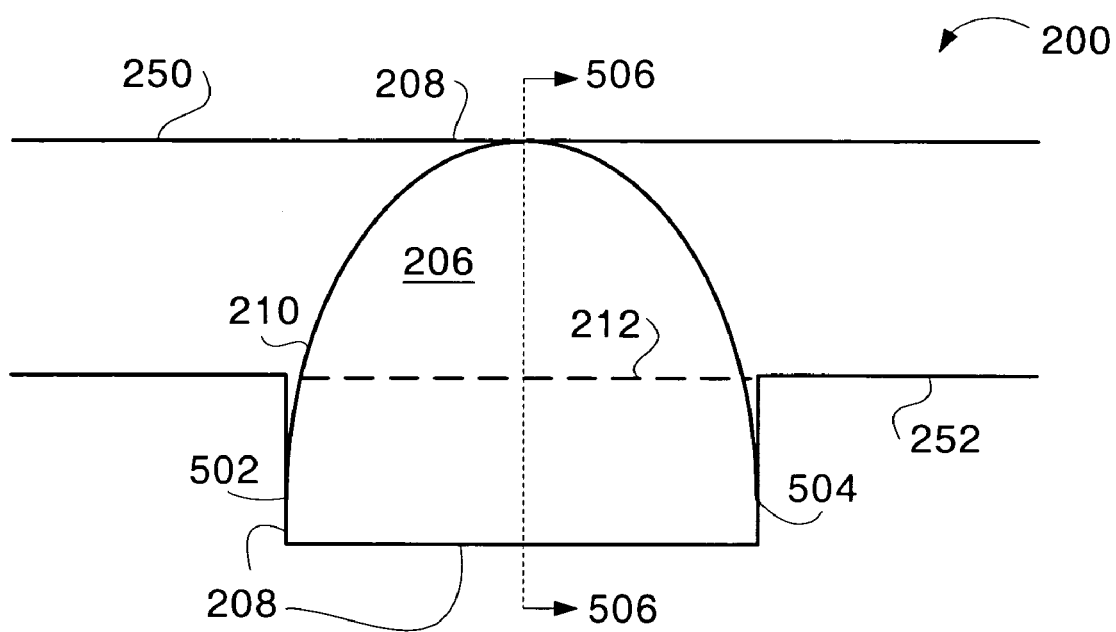
FIG. 5 is a cross sectional side view that illustrates the valve when the piece of electroactive material is expanded.

FIG. 5 is a cross sectional side view that illustrates the valve 200 when the piece of electroactive material 210 is expanded. To expand the piece of electroactive material 210, a voltage difference may be applied across the piece of electroactive material 210 by the top and bottom electrodes. In an embodiment, this voltage difference applied across the piece of electroactive material 210 may be between about 1000 volts and about 4000 volts. In another embodiment, the voltage difference applied across the piece of electroactive material 210 may be between about 2000 volts and about 3500 volts. In other embodiments, different voltage differences may be applied across the piece of electroactive material 210.

The expanded piece of electroactive material 210 contacts the housing 208 at points 502 and 504, which may be the same as points 216 and 218 of FIG. 2. The cross section of the piece of electroactive material 210 between the points 502 and 504 is in the shape of an arc, with a second arc length that is the distance along the piece of electroactive material 210 between points 502 and 504. This second arc length of the expanded piece of electroactive material 210 may be greater than the arc length of the contracted piece of electroactive material 210 between points 216 and 218.

The expanded piece of electroactive material 210 may extend beyond the boundary 212 of the fluid volume 206 and into the fluid volume 206. In some embodiments, the piece of electroactive material 210 may extend part way into the fluid volume 206 to reduce fluid flow through the valve 200. In other embodiments, the piece of electroactive material 210 may extend all the way across the fluid volume 206 to contact the housing wall 208 and substantially completely block the flow of fluid from the inlet 202 through the fluid volume 206 to the outlet 204.

Figure 6A:
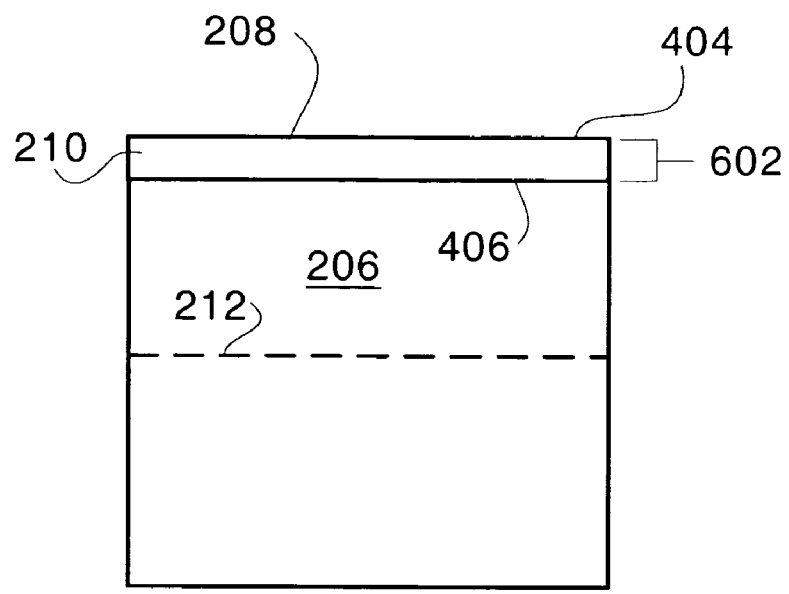
FIGS. 6a and 6b are cross sectional views that illustrate the valve and the expanded piece of electroactive material.
Figure 6B:
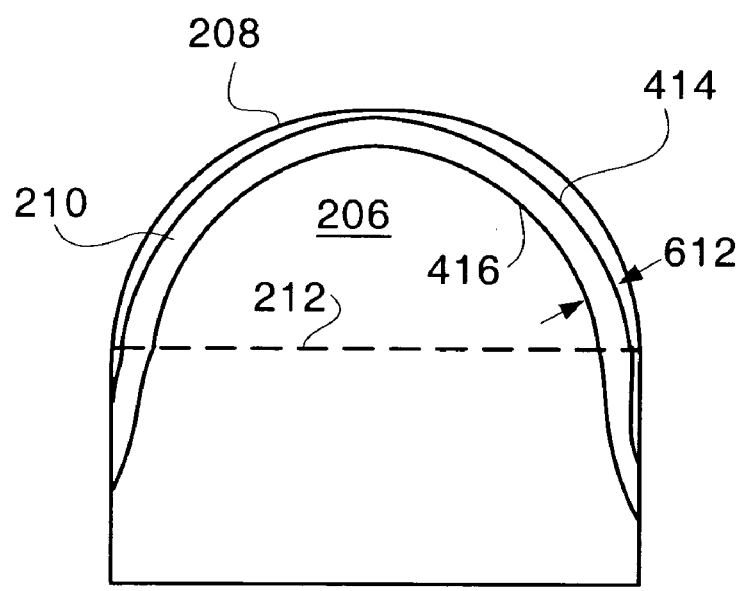

FIGS. 6a and 6b are cross sectional views that illustrate the valve and the expanded piece of electroactive material 210 taken through line 506—506 of FIG. 5 according to two different embodiments that correspond to the embodiments of FIGS. 4a and 4b respectively. FIG. 6a illustrates one embodiment in which the expanded remains substantially straight along the horizontal axis of FIG. 6a. The expansion of the piece of electroactive material 210 and the accompanying increase in arc length has resulted in the piece of electroactive material 210 being at least partially above the boundary 212 and partially or fully blocking the flow of fluid through the valve 200. As illustrated in FIG. 6a, the top surface 404 of the expanded piece of electroactive material 210 may contact the top housing wall 208 and substantially completely block fluid flow through the valve 200. In other embodiments, the top surface 404 of the expanded piece of electroactive material 210 may fail to contact the top housing wall 208 so that some fluid may continue to flow through the valve 200. The expanded piece of electroactive material 210 may have a second thickness 602 that is thinner than the thickness 402 of the contracted piece of electroactive material 210.

FIG. 6b illustrates the second embodiment in which the piece of electroactive material 210 may be a sheet of electroactive material that has a dome shape. The expansion of the piece of electroactive material 210 results in expansion of the dome shape. The expansion of the piece of electroactive material 210 and the accompanying expansion of the dome has resulted in the piece of electroactive material 210 being at least partially above the boundary 212 and partially or fully blocking the flow of fluid through the valve 200. As illustrated in FIG. 6a, the top surface 414 of the expanded piece of electroactive material 210 may nearly contact the top housing wall 208, which also has a dome shape, to reduce fluid flow through the valve 200. Alternatively, the dome of the piece of electroactive material 210 may contact the top housing wall 208 to substantially completely block fluid flow through the valve 200. In other embodiments, top housing wall 208 may have a shape different than a dome so that while the expanded piece of electroactive material 210 may contact the upper housing wall 208 at one or more points, the piece of electroactive material 210 does not conform to the housing wall 208 and does not completely block fluid flow through the valve 200. The expanded piece of electroactive material 210 may have a second thickness 612 that is thinner than the thickness 412 of the contracted piece of electroactive material 210.

Figure 7:
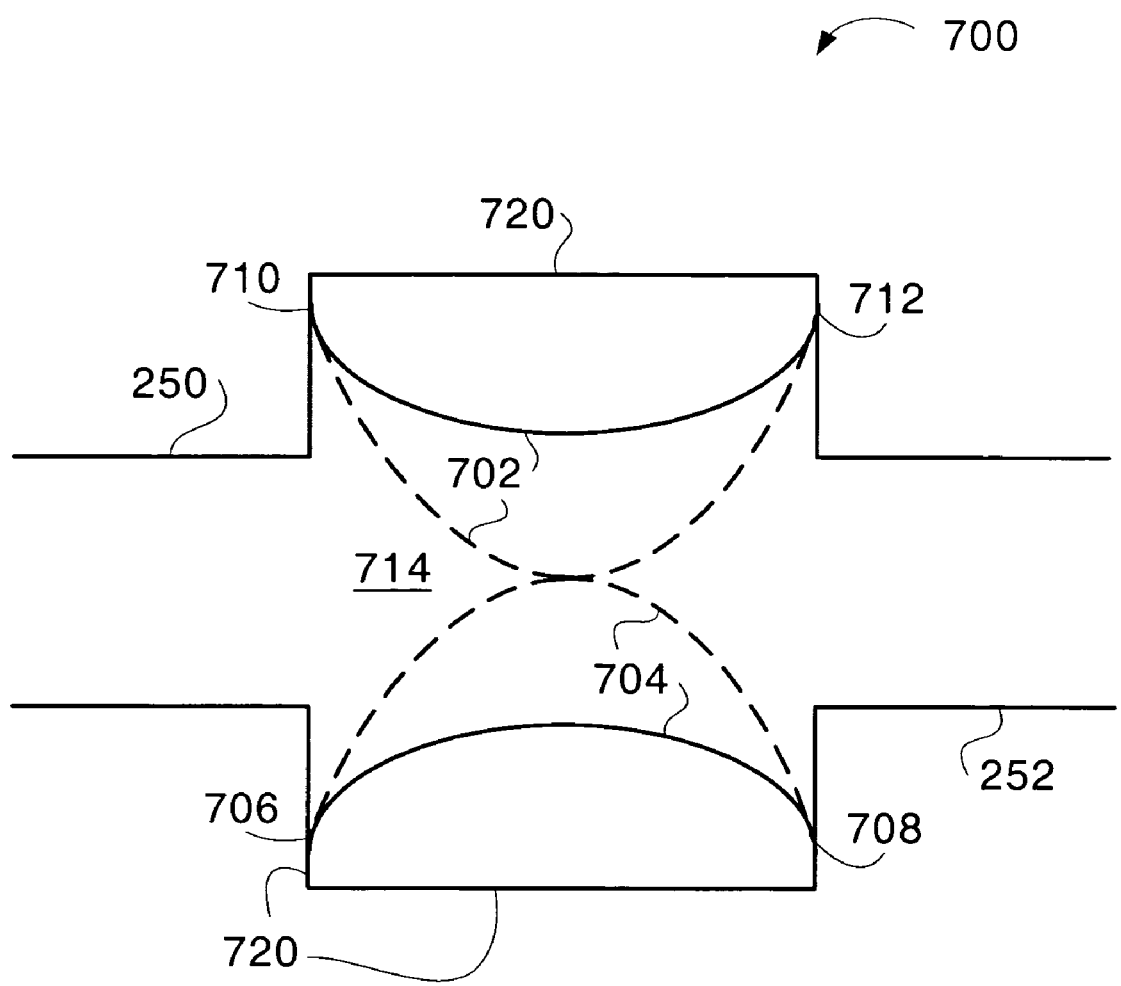
FIG. 7 is a cross sectional side view that illustrates another embodiment of a valve.

FIG. 7 is a cross sectional side view that illustrates another embodiment of a valve 700 that may be used in the system 100 to increase effectiveness of the pump 108. The valve 700 may be similar to the valve 200 of FIG. 2. However, instead of a single piece of electroactive material 210, the valve 700 of FIG. 7 may have two or more pieces 702, 704 of electroactive material. Each of the pieces of electroactive material 702, 704 may have a shape, such as the arced shape of FIGS. 4a and 6a, the dome shape of FIGS. 4b and 6b, or another shape.

In an embodiment, the first piece of electroactive material 702 may contact the housing 720 at points 710 and 712. In a contracted state, the first piece of electroactive material 702 may have a smaller arc length along the solid line between points 710 and 712 that may not extend into the fluid volume 714 so that fluid may flow freely between the inlet and the outlet. In an expanded state, the first piece of electroactive material 702 may have a larger arc length along the dashed line between points 710 and 712 that may extend into the fluid volume 714 to reduce the flow of fluid between the inlet and the outlet.

Similarly, the second piece of electroactive material 704 may contact the housing 720 at points 706 and 708. In a contracted state, the second piece of electroactive material 704 may have a smaller arc length along the solid line between points 706 and 708 that may not extend into the fluid volume 714 so that fluid may flow freely between the inlet and the outlet. In an expanded state, the second piece of electroactive material 704 may have a larger arc length along the dashed line between points 706 and 708 that may extend into the fluid volume 714 to reduce the flow of fluid between the inlet and the outlet.

When both the first and second pieces of electroactive material 702, 704 are in an expanded state, they may contact each other to substantially completely block the fluid volume 714 and prevent fluid from flowing between the inlet and the outlet in an embodiment. In other embodiments, the first and second pieces of electroactive material 702, 704 may only partially prevent fluid from flowing between the inlet and the outlet when in expanded states.

Figure 8A:
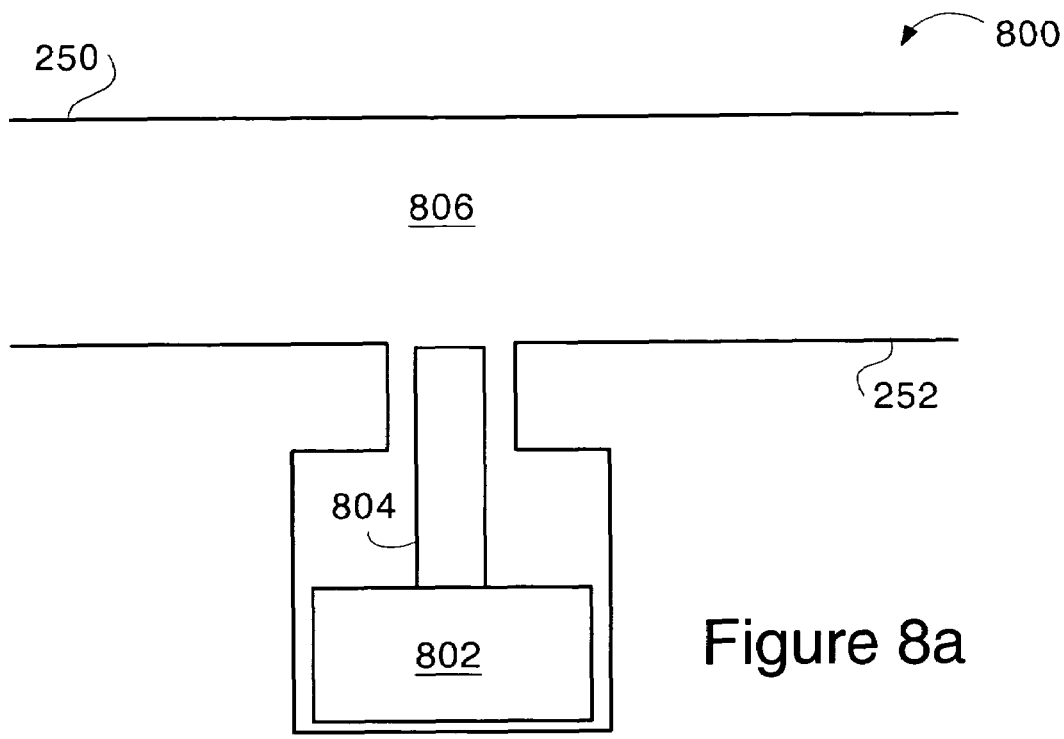
FIGS. 8a and 8b are cross sectional side views that illustrate yet another embodiment of a valve.
Figure 8B:
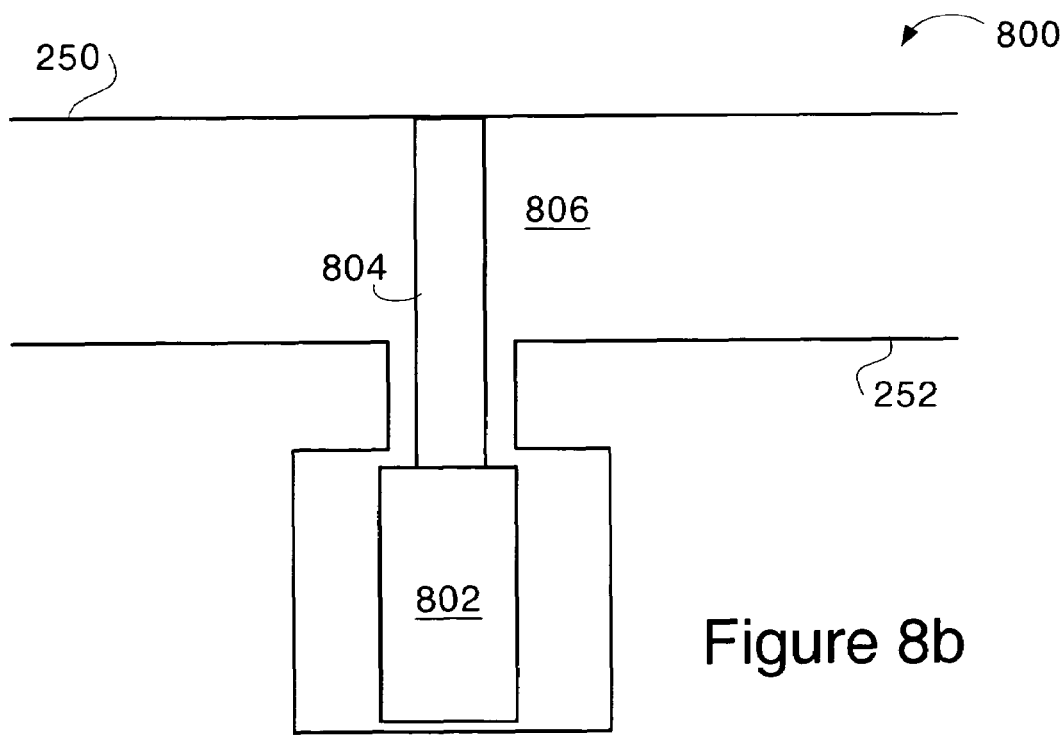

FIGS. 8a and 8b are cross sectional side views that illustrate yet another embodiment of a valve 800 that may be used in the system 100 to increase effectiveness of the pump 108. The valve 800 may include a fluid volume 806 to allow fluid to flow between an inlet line 250 and an outlet line 252.

FIG. 8a illustrates a piece of electroactive material 802 in a contracted state. There may be a restrictor component 804 connected to the piece of electroactive material 802. When the piece of electroactive material 802 is in a contracted state the restrictor component may be substantially out of the fluid volume 806 so that fluid may flow freely between the inlet line 250 and the outlet line 252.

FIG. 8b illustrates the piece of electroactive material 802 in an expanded state. As the electroactive material 802 expands vertically, the restrictor component 804 connected to the piece of electroactive material 802 extends into the fluid volume 806. The restrictor component 804 may extend enough to partially obstruct fluid flow through the fluid volume 806, or may extend enough to substantially completely block fluid flow between the inlet line 250 and the outlet line 252.

Figure 9:
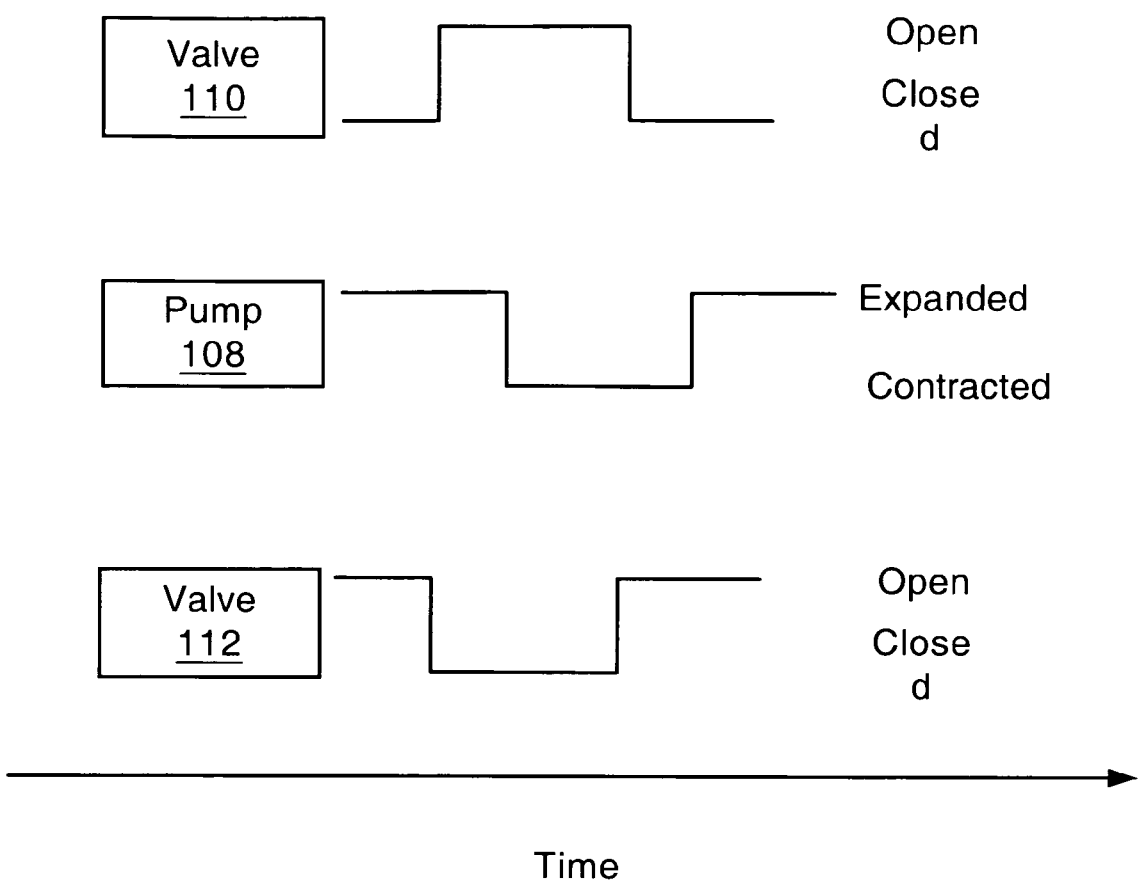
FIG. 9 is a timing diagram that illustrates operation of the pump and valves of the system.

FIG. 9 is a timing diagram that illustrates operation of the pump 108 and valves 110, 112 of the system 100 of FIG. 1 according to one embodiment. At a first time (at the left of FIG. 9), the valve 110 at the inlet to the pump 108 is closed, the diaphragm in the pump 108 is expanded, and the valve 112 at the outlet of the pump 108 is open. At a second time, the valve 110 at the inlet to the pump 108 opens, which allows fluid to flow into the pump 108 from the pump inlet. At approximately the same time, the valve 112 at the outlet to the pump 108 closes, which prevents fluid from leaving the pump 108 from the pump outlet. At a third time, the diaphragm of the pump 108 contracts, drawing in fluid. Since the valve 112 at the outlet to the pump 108 is closed, fluid is drawn in from the inlet, through the open valve 110 at the inlet of the pump 108.

At a third time, the valve 110 at the inlet to the pump 108 closes, which prevents fluid from leaving the pump 108 from the pump inlet. At approximately the same time, the valve 112 at the outlet to the pump 108 opens, which allows fluid to flow from the pump 108 through the pump outlet. At a fourth time, the diaphragm of the pump 108 expands, expelling fluid from the pump 108. Since the valve 110 at the inlet to the pump 108 is closed and the valve 112 at the outlet to the pump 108 is open, fluid is expelled from the outlet of the pump, through the open valve 112. Thus, by controlling the timing of the opening and closing of the valves 110, 112, the pump 108 may pump fluid through the system 100 more efficiently.

In other embodiments, the pump 108 and valves 110, 112 may be controlled differently. For example, the valves 110, 112 may be switched from open to closed and closed to open at about the same time as the pump 108 expands or contracts. In another embodiment, the circuitry 116 may monitor the temperature of the heat producing device 102 and modify the speed and/or efficiency of the pump 108 and/or valves 110, 112 to keep the temperature of the heat producing device 102 below a predetermined level.

Figure 10:
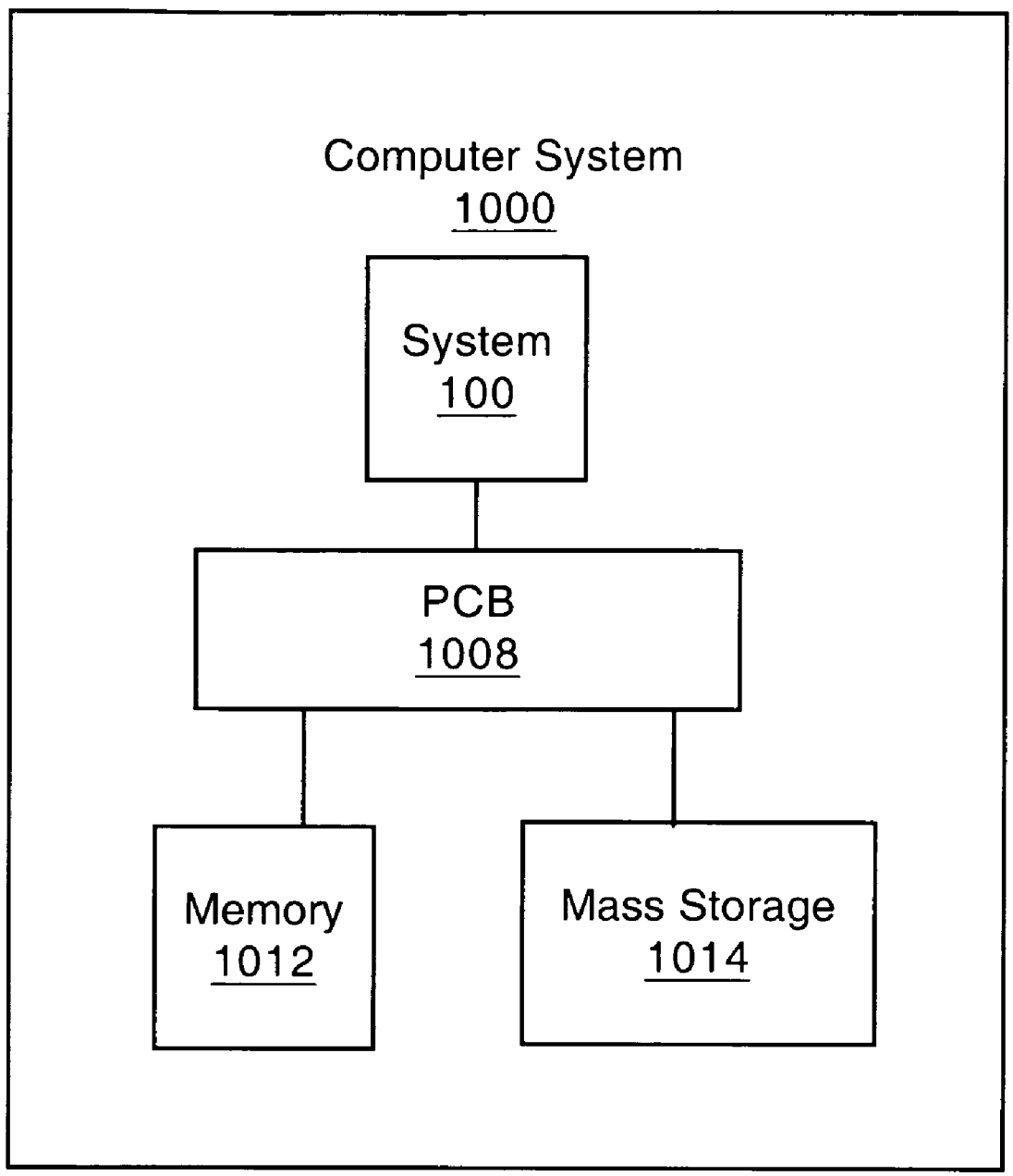
FIG. 10 is a schematic diagram of a computer system.

FIG. 10 is a schematic diagram of a computer system 1000 according to one embodiment of the present invention. The computer system 1000 may include the system 100 of FIG. 1a, in which the heat producing device 102 may include a microprocessor die.

The microprocessor die of the system 100 may be connected to a structure such as a printed circuit board ("PCB") 1008 by connectors such as solder balls or other connectors. Additionally, the computer system 1000 may include a memory 1012 and/or a mass storage unit 1014, which may be connected to the PCB 1008. The memory 1012 may be any memory, such as random access memory, read only memory, or other memories. The mass storage unit 1014 may be a hard disk drive, an EEPROM, or another mass storage device. The computer system 1000 may also include other components such as input/output units, a microprocessor, or other components. The computer system 1000 may be a "personal computer" such as are commonly used by individuals and businesses. Alternatively, the computer system 1000 may be another type of computer, such as a wireless phone having a microprocessor, memory, and/or other components.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

We claim:

1. A device, comprising:
    an inlet fluid line, wherein the inlet fluid line has a cross sectional area of about 0.012 square inches or less;
    a valve housing including an inlet connected to the inlet fluid line, an outlet, and a fluid volume to allow fluid to flow from the inlet to the outlet;
    an outlet fluid line connected to the outlet;
    a first niece of electro-active material connected to the valve housing; and
    circuitry electrically connected to the first piece of electro-active material to apply a first voltage across the first piece of electro-active material to cause the first piece of electro-active material to have a first shape that does not substantially restrict fluid flow through the fluid volume of the valve housing, and to apply a second voltage across the first piece of electro-active material to cause the first piece of electro-active material to have a second shape, the second shape that at least partially restricts the flow of fluid from the inlet through the fluid volume to the outlet.

2. A device, comprising:
    an inlet fluid line;

a valve housing including an inlet connected to the inlet fluid line, an outlet, and a fluid volume to allow fluid to flow from the inlet to the outlet;
an outlet fluid line connected to the outlet;
a first piece of electro-active material connected to the valve housing, wherein the valve housing and the first piece of electro-active material comprise a first valve;
circuitry electrically connected to the first piece of electro-active material to apply a first voltage across the first piece of electro-active material to cause the first piece of electro-active material to have a first shape that does not substantially restrict fluid flow through the fluid volume of the valve housing, and to apply a second voltage across the first piece of electro-active material to cause the first niece of electro-active material to have a second shape, the second shape that at least partially restricts the flow of fluid from the inlet through the fluid volume to the outlet;
a pump having an electro-active diaphragm, a pump inlet, and a pump outlet the pump inlet connected to the outlet fluid line of the first valve;
a second valve having a second piece of electro-active material and connected to the pump outlet;
a cooling device connected to the second valve to receive fluid pumped by the pump, the fluid received being heated when within the cooling device;
a heat producing device connected to the cooling device to transfer heat from the heat producing device to the cooling device;
a heat exchanger connected to the cooling device to receive the heated fluid from the cooling device and to transfer heat to an environment around the heat exchanger; and
wherein the circuitry is also electrically connected to the pump and the second valve to apply voltages to the pump and the first and second valve, the voltages timed to cause the first valve to be closed and the second valve to be open when the diaphragm within the pump expands and to cause the first valve to be open and the second valve to be closed with the diaphragm within the pump contracts.

3. The device of claim 2, wherein:
the first piece of electro-active material is a sheet of electro-active material;
the first shape of the first piece of electro-active material is that of the sheet curved in an arc with a first arc length; and
the arc of the first shape has a convex surface closer to the fluid volume and a concave surface further from the fluid volume.

4. The device of claim 3, wherein the second shape of the first piece of electro-active material is that of the sheet curved in an arc with a second arc length larger than the first arc length.

5. The device of claim 4, wherein the second shape of the first piece of electro-active material extends at least partially into the fluid volume to at least partially restrict flow of fluid from the inlet through the fluid volume to the outlet.

6. The device of claim 4, wherein the second arc length is greater than the first arc length by about 20% to about 50%.

7. The device of claim 4, wherein second shape of the first piece of electro-active material substantially completely blocks the flow of fluid from the inlet through the fluid volume to the outlet.

8. The device of claim 4, further comprising a second piece of electro-active material connected to the valve housing, and wherein the circuitry is electrically connected to the second piece of electro-active material to apply a third voltage across the first piece of electro-active material to cause the second piece of electro-active material to have a third shape that does not substantially extend into the fluid volume of the valve housing, and to apply a fourth voltage across the second piece of electro-active material to cause the second piece of electro-active material to have a fourth shape, the fourth shape being to cause at least partial constriction of the flow of fluid from the inlet through the fluid volume to the outlet.

9. The device of claim 8, wherein the circuitry is adapted to apply the second voltage across the first piece of electro-active material to cause the first piece of electro-active material to have the second shape, and the fourth voltage across the second piece of electro-active material to cause the second piece of electro-active material to have the fourth shape at approximately the same time, and wherein the second shape of the first piece of electro-active material and the fourth shape of the second of the first piece of electro-active material contact each other to substantially completely block the flow of fluid from the inlet through the fluid volume to the outlet.

10. The device of claim 2, further comprising a restrictor component coupled to the first piece of electro-active material, wherein the second shape of the first piece of electro-active material is to cause the restrictor component to extend at least partially into the fluid volume to at least partially restrict flow of fluid from the inlet through the fluid volume to the outlet.

11. A device, comprising:
a diaphragm pump to draw fluid in from a pump inlet and expel fluid out through a pump outlet;
a first valve including an electro-active material to allow fluid to flow into the diaphragm pump when the diaphragm pump draws fluid in from the pump inlet and to at least partially restrict fluid flow when the diaphragm pump expels fluid out through the pump outlet; and
a second valve including an electro-active material to allow fluid to flow from the diaphragm pump when the diaphragm pump expels fluid out through the pump outlet and to at least partially restrict fluid flow when the diaphragm pump draws fluid in from the pump inlet.

12. The device of claim 11, further comprising circuitry to apply voltages to the diaphragm pump and the first and second valves, wherein the electro-active material of the first valve is adapted to take a first shape to allow fluid to flow through the first valve in response to the circuitry applying a first voltage across the electro-active material, and the electro-active material of the first valve is adapted to take a second shape to at least partially restrict fluid from flowing through the first valve in response to the circuitry applying a second voltage across the electro-active material.

13. The device of claim 12, wherein the second voltage is in a range from about 1500 volts to about 3500 volts.

14. The device of claim 13, wherein the first voltage is about zero volts.

15. The device of claim 11, further comprising a fluid line connected to the first valve and the diaphragm pump to allow fluid to flow between first valve and the diaphragm pump.

16. The device of claim 15, wherein the fluid line has a substantially elliptical cross section with a maximum distance across the ellipse being less than about one-eighth of an inch.

17. The device of claim 15, wherein the fluid line has a substantially rectangular cross section with a maximum length of a side wall of the rectangle being less than about one-eight of an inch.

18. The device of claim 11, further comprising:
a microprocessor;
a cooling device connected to the microprocessor to receive heat from the microprocessor, and connected to the diaphragm pump; and
wherein the diaphragm pump is adapted to pump fluid through the cooling device, the fluid pumped through the cooling device being to receive heat from the cooling device and remove the heat from the cooling device.

19. The device of claim 18, further comprising:
memory connected to the microprocessor;
mass storage to the microprocessor; and
a motherboard including a chipset connected to the microprocessor;
a second cooling device connected to the chipset to receive heat from the chipset, and connected to the diaphragm pump; and
wherein the diaphragm pump is adapted to pump fluid through the second cooling device, the fluid pumped through the second cooling device being to receive heat from the second cooling device and remove the heat from the second cooling device.

20. A method, comprising:
applying a first voltage to a first piece of electro-active material in an inlet valve to cause the first piece of electro-active material to take a first shape that at least partially restricts fluid flow through the inlet valve;
applying a first signal to a pump with an inlet connected to the inlet valve to cause the pump to expel fluid from the pump, the first piece of electro-active material having the first shape during at least some of a time that the pump expels fluid from the pump; applying a second voltage to a second piece of electro-active material in an outlet valve connected to an outlet of the pump to cause the second piece of electro-active material to take a second shape that does not substantially restrict fluid flow through the inlet valve, the second piece of electro-active material having the second shape during at least some of the time that the pump expels fluid from the pump;
applying a third voltage to the first piece of electro-active material in the inlet valve to cause the first piece of electro-active material to take a third shape that does not substantially restrict fluid flow through the inlet valve;
applying a second signal to the pump with an inlet connected to the inlet valve to cause the pump to draw in fluid to the pump, the first piece of electro-active material having the third shape during at least some of a time that the pump draws in fluid to the pump; and
applying a fourth voltage to the second piece of electro-active material in the outlet valve to cause the second piece of electro-active material to take a fourth shape that at least partially restricts fluid flow through the outlet valve, the second piece of electro-active material having the fourth shape during at least some of the time that the pump draws in fluid to the pump.

21. The method of claim 20, wherein the first shape of the first piece of electro-active material is that of a sheet curved in an arc with a first radius and the third shape of the first piece of electro-active material is that of the sheet curved in an arc with a second radius smaller than the first radius.

22. The method of claim 20, wherein the first voltage, the first signal, and the second voltage are applied at approximately the same time.

23. The method of claim 20, wherein applying the first voltage and the second voltage occur before applying the first signal.

24. The method of claim 23, wherein applying the third voltage and the fourth voltage occur after applying the first signal and before applying the second signal.

* * * * *